(12) United States Patent
Yamazaki

(10) Patent No.: US 6,573,575 B1
(45) Date of Patent: Jun. 3, 2003

(54) DRAM MOS FIELD EFFECT TRANSISTORS WITH THRESHOLDS DETERMINED BY DIFFERENTIAL GATE DOPING

(75) Inventor: Yasushi Yamazaki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/684,840

(22) Filed: Oct. 6, 2000

(30) Foreign Application Priority Data

Oct. 6, 1999 (JP) .......................................... 11-285483

(51) Int. Cl.[7] .............................................. H01L 29/76
(52) U.S. Cl. ........................ 257/392; 257/391; 257/407; 257/412; 257/413; 438/217; 438/276; 438/289; 438/291
(58) Field of Search ................................ 257/391, 392, 257/407, 412, 413; 438/217, 276, 289, 291

(56) References Cited

FOREIGN PATENT DOCUMENTS

| JP | 63-228745 | 9/1988 | | |
|---|---|---|---|---|
| JP | 3-153079 | 7/1991 | | |
| JP | 03153079 A | * 7/1991 | ......... | H01L/29/784 |
| JP | 4-302466 | 10/1992 | | |
| JP | 4-357865 | 12/1992 | | |
| JP | 9-36318 | 2/1997 | | |
| JP | 9-74141 | 3/1997 | | |
| JP | 9-167832 | 6/1997 | | |
| JP | 10247725 A | * 9/1998 | ......... | H01L/27/108 |
| JP | 11-26711 | 1/1999 | | |
| JP | 11-214656 | 8/1999 | | |
| JP | 2001-35929 | 2/2001 | | |

* cited by examiner

Primary Examiner—Nathan J. Flynn
Assistant Examiner—Scott R. Wilson
(74) Attorney, Agent, or Firm—Scully, Scott, Murphy & Presser

(57) ABSTRACT

In a semiconductor device including a plurality of n-channel transistors having different threshold voltages and each having a gate electrode including an n-type polysilicon film, the impurity concentration of the n-type polysilicon film included in the gate electrode of an n-channel transistor having a relatively high threshold, is lower than the impurity concentration of the n-type polysilicon film included in the gate electrode of an n-channel transistor having a relatively low threshold. Thus, the n-channel transistor having a relatively high threshold can be realized in the semiconductor device, without various problems such as an increased leak current caused by increasing the impurity concentration of the channel region, the lowered subthreshold factor caused by using the $p^+$ polysilicon film in the gate electrode, the deteriorated insulating performance of the gate oxide film, the increased number of fabricating steps, or the dropped reliability of the transistor.

4 Claims, 6 Drawing Sheets

MEMORY CELL | PERIPHERAL CIRCUIT

DRAM MOS FIELD EFFECT TRANSISTORS WITH THRESHOLDS DETERMINED BY DIFFERENTIAL GATE DOPING

BACKGROUND OF THE INVENTION

The present invention relates to a semiconductor device such as DRAM (dynamic random access memory) having transistors having different threshold voltages, and a method for fabricating the same.

The DRAM comprises a memory cell array composed of a number of memory cells for storing information, and a peripheral circuit including a decoding circuit for selecting a memory cell, the memory cells and the peripheral circuit being formed on the same semiconductor substrate. Recently, a memory-logic mixed construction has been adopted in which the DRAM and a logic circuit developed by a user are formed on the same semiconductor substrate. In this specification, it should be understood that the peripheral circuit includes the logic circuit.

A memory cell includes a capacitor accumulating a signal charge for storing information, and a transistor functioning as a switching device for accumulating the signal charge into the capacitor and for reading out the signal charge accumulated in the capacitor. Incidentally, the transistor is ordinarily constituted of a FET (field effect transistor) having a MOS (metal oxide semiconductor) structure or a MIS (metal insulator semiconductor), because these transistors are convenient for realizing a high integration density. In addition, the peripheral circuit is constituted of FETs having the same structure as that of the transistor used in the memory cell, in order to make a fabricating processing in common with that for the memory cell. In the following, explanation will be made under the assumption that an n-channel MOS FET is used as transistors for the memory cells and transistors for the peripheral circuit.

When the n-channel MOS FET is used as transistors used in the DRAM, a recent MOSFET has a gate electrode (word line) formed of an $n^+$ polysilicon film or alternatively a multilayer film composed of a metal silicide and the $n^+$ polysilicon film (polycide film). This is because the work function of the $n^+$ silicon (Si) of the gate electrode is lower than the work function of a p-type silicon in a channel region by about 1V, so that it is possible to easily set the threshold of the FET at a low value.

On the other hand, it is known that, in the MOS FET, even when a gate voltage lower than the threshold voltage is applied, a drain current flows slightly. Here, the drain current flowing when the gate voltage is 0V, is called a subthreshold leak current If there is the subthreshold leak current in the FET used in the DRAM memory cell, the signal charge accumulated in the memory cell capacitor is discharged so that it becomes impossible to hold the signal charge. Therefore, the FET used in the DRAM memory cell is required to have as a small subthreshold leak current as possible.

In order to reduce the subthreshold leak current, it is sufficient if the threshold is set to be high. In the FET used in the DRAM memory cell, therefore, the threshold is set to be relatively high (on the order of 1.2V) in order to simultaneously prevent a malfunction caused by noises or others.

In the FET used in the peripheral circuit of the DRAM, on the other hand, the threshold is set to be relatively low (on the order of 0.4 to 0.6V) because reduction of an on-resistance to realize a high speed operation and reduction of a power consumption, are in preference to the reduction of the subthreshold leak current.

In the prior art DRAM, the threshold voltage was changed by making the impurity concentration of the channel region in the FET used in the peripheral circuit, different from the impurity concentration of the channel region in the FET of the memory cell. Specifically, the impurity concentration of the channel region in the FET of the memory cell is set to be five to ten times the impurity concentration of the channel region in the FET used in the peripheral circuit.

Referring to FIG. 4, there is shown a partial diagrammatic section view of the DRAM for illustrating one example of the prior art semiconductor device.

As shown in FIG. 4, the prior art DRAM includes a memory cell FET and a peripheral circuit FET which are formed on a p-type semiconductor substrate 1 and which are isolated from each other by a field oxide film 2 formed of an insulating film such as silicon dioxide ($SiO_2$), in a shallowly embedded structure at a principal surface of the substrate.

As mentioned above, the memory cell is composed of an FET and a capacitor. Each of the memory cell FET and the peripheral circuit FET includes a drain region 3 and a source region 4 constituted of an $n^+$ diffused layer formed at the principal surface of the substrate, a channel region 5 or 15 formed between the drain region 3 and the source region 4, a gate insulator film 6 formed on the principal surface of the substrate, directly above the channel region 5 or 15, and constituted of an insulating film such as silicon dioxide ($SiO_2$), and agate electrode formed of a $n^+$ polysilicon film 8 and a metal silicide film 9 stacked on the gate insulator film 6.

The capacitor includes a capacitor lower electrode 11 connected to the drain 3 of the memory cell FET and becoming as one electrode of a pair of electrodes of a capacitor for holding information, a capacitor upper electrode 12 becoming as the other electrode of the capacitor, and a capacitor dielectric film 13 sandwiched between the capacitor lower electrode 11 and the capacitor upper electrode 12.

Incidentally, each of he capacitor lower electrode 11 and the capacitor upper electrode 12 is formed of an $n^+$ polysilicon, and the capacitor dielectric film 13 is formed of a silicon nitride film ($Si_3N_4$). The memory cell FET and the peripheral circuit FET have the same structure, but the prior art DRAM was so formed that the impurity concentration of the channel region 15 in the peripheral circuit FET is lower than the impurity concentration of the channel region 5 in the memory cell FET. (Difference in impurity concentration is indicated in FIG. 4 by difference in thickness of the dotted line in the channel region.)

Now, the method for fabricating the prior art DRAM shown in FIG. 4 will be described with reference to FIGS. 5A to 5F, which are diagrammatic sectional views of the DRAM for illustrating various steps of the semiconductor device fabricating process.

First, a silicon nitride film is formed on a principal surface of a p-type semiconductor substrate 1, and is patterned to have a predetermined shape. The substrate exposed in an opening of the patterned silicon nitride film is selectively oxidized to form a field oxide film 2 having the thickness on the order of 300 nm, which constitutes an inactive region for a device isolation, as shown in FIG. 5A.

Succeedingly, a pad oxide film 20 having the thickness on the order of 20 nm is formed on the whole of the principal surface of the substrate by means of a thermal oxidation. In order to form the channel regions 5 and 15 of the FETs, boron (B) is ion-implanted through the pad oxide film 20 with an energy of 30 KeV and a dose of 1 to $2\times10^{12}$ atoms/$cm^2$ (FIG. 5B).

Then, a photoresist 21 is formed on the substrate to cover a region in which the peripheral circuit. FET is formed, and boron (B) is further ion-implanted into a region in which the memory cell FET is formed, with an energy of 30 KeV and a dose of 7 to $8 \times 10^{12}$ atoms/cm$^2$ (FIG. 5C). Thus, by increasing the implanted amount of boron into the region in which the memory cell FET is formed, the impurity concentration of the channel region 5 in the memory cell FET and the impurity concentration of the channel region 15 in the peripheral circuits FET are made different from each other Here, the order of the ion implantation shown in FIG. 5B and the ion implantation shown in FIG. 5C can be exchanged.

Thereafter, the pad oxide film 20 and the photoresist 21 formed on the substrate 1 are removed, and a gate oxide film 6 having the thickness on the order of 10 nm is formed on the principal surface of the substrate by means of a thermal oxidation. Then, an n$^+$ polysilicon film 8 having a high impurity concentration (on the order of 2 to $3 \times 10^{20}$ atoms/cm$^3$) and a thickness on the, order of 100 nm, and a refractory metal silicide film (WSi) 9 having the thickness on the order of 100 nm, which are used to form a gate electrode, are deposited on the gate oxide film 6 by means of a CVD (chemical vapor deposition) process or a reactive sputtering (FIG. 5D).

Succeedingly, the n$^+$ polysilicon film 8 and the metal silicide film 9 are patterned by a lithography, to form a gate electrode of the memory cell FET and a gate electrode of the peripheral circuit FET. In addition, in order to form the drain region 3 and the source region 4 of each FET, arsenic (As) is ion-implanted with a dose of $1 \times 10^{16}$ atoms/cm$^2$, and then, is thermally diffused to form an n$^+$ diffused layer (FIG. 5E).

Thereafter, an interlayer insulating film 10 having the thickness on the order of 500 nm is deposited on the whole of the principal surface of the substrate to cover the gate electrodes. A contact hole is formed in the interlayer insulating film 10 to reach the drain region 4 of the memory cell FET, and a phosphorus (P) doped n$^+$ polysilicon is deposited to fill up the contact hole and to form a capacitor lower electrode 11. Succeedingly, a capacitor dielectric film 13 having the thickness on the order of 8 nm is deposited on the capacitor lower electrode 11. Furthermore, a phosphorus (P) doped n$^+$ polysilicon is deposited on the capacitor dielectric film 13 to have a thickness on the order of 200 nm, thereby to form a capacitor upper electrode 12. Finally, an interlayer insulating film 10 is deposited on the whole of the principal surface of the substrate to cover the capacitor upper electrode 12 (FIG. 5F). Incidentally, in FIGS. 4 and 5F, the interlayer insulating film 10 shown as being formed of only one layer, but is actually formed of a plurality of layers as seen from the above mentioned process.

In the prior art DRAM shown in FIG. 4, the source-drain subthreshold leak current can be reduced by increasing the impurity concentration of the channel region 5. However, another problem occurs in which a leak current increases between the substrate 1 of the p-type semiconductor and the source region 4 or the drain region 3 of the n-type semiconductor, with the result that the performance of holding the signal charge by the capacitor drops. In the FET microminiaturized with an increase of the memory capacity as in a recent DRAM, since a source-drain distance gradually becomes short, it is necessary to increase the impurity concentration of the channel region 5, with the result that the leak current in the PN junction increases more or more.

In order to overcome the above mentioned problem, for example, Japanese Patent Application Pre-examination Publication No. JP-A-04-357865, JP-A-09-036318 and JP-A-11-026711 propose a technology of using a p$^+$ polysilicon film in the gate electrode of a FET whose threshold is desired to be elevated.

FIGS. 6A and 6B are energy band diagrams for illustrating an energy level of the gate electrode and the semiconductor substrate in the FET in the prior art semiconductor device. FIG. 6A illustrate an energy band diagram when the gate electrode is formed of the n$^+$ polysilicon film, and FIG. 6B illustrate an energy band diagram when the gate electrode is formed of the p$^+$ polysilicon film. In FIGS. 6A and 6B, the dotted lines indicate the energy level at the time of the gate voltage Vg=0 V, and the solid lines indicate the energy level when the gate voltage Vg is the threshold $V_T$.

As seen from FIGS. 6A and 6B, since the work function of the p$^+$ polysilicon is higher than that of the n$^+$ polysilicon by about 1V, if the gate electrode of the FET is formed of the p$^+$ polysilicon film, it is possible to increase the threshold voltage of the memory cell FET even if the impurity concentrations of the channel region is not increased.

However, in the FET having the gate electrode formed by using the p$^+$ poly silicon film, as seen from FIG. 6B, since a lowermost point of the energy level of the conduction band in the semiconductor substrate is situated at a position separated from the gate oxide film, the channel region is formed within the body of the semiconductor substrate, not in the neighborhood of the surface of the semiconductor substrate, as shown in FIG. 7 (which illustrates a condition in that the channel elongates from the drain by action of the voltage applied between the source and the drain). In this case, the subthreshold factor of the FET lowers, with the result that controllability of the source-drain current by the gate voltage is deteriorated, and the subthreshold leak current increases.

In addition, boron (B) included in the p$^+$ polysilicon film is liable to be captured into SiO$_2$ of the gate oxide film in a heat treatment step, in comparison with phosphorus (p) included in the n$^+$ polysilicon film. Therefore, the threshold voltage of the PET changes, and the insulating performance of the gate insulating film lowers, so that reliability drops.

In addition, at the present time, since there is no p-type doped polysilicon, it is necessary to ion-implant an impurity such as boron (B) into a silicon film so as to form a p$^+$ polysilicon film. In a today's highly integrated semiconductor device, since the gate electrode and the gate insulating film become thin because of an advanced microminiaturization, there is possibility that the implanted boron ions penetrate through these films to enter into the semiconductor substrate. As a result, there is possibility that, in the heat treatment step, the entered ions are diffused into the channel region, so that the impurity concentration of the channel region becomes different from a designed value.

Furthermore, when the gate electrode of the memory cell FET is formed by using the p$^+$ polysilicon film and the gate electrode of the peripheral circuit FET is formed by using the n$^+$ polysilicon film, it is not possible to use for example the n$^+$ polysilicon film as a common interconnection material for connecting to the respective gate electrodes, and therefore, the number of fabricating steps increases. If the n$^+$ polysilicon film was formed on the p$^+$ polysilicon film, the phosphorus (P) in the n$^+$ polysilicon film is diffused into the p$^+$ polysilicon film in a heat treatment performed at a later step, so that a region including only a reduced amount of impurity (phosphorus) is formed, with the result that a so called PIN structure is formed. Here, even if a metal silicide (for example WSi) is formed between the p$^+$ polysilicon film and the n⁺ polysilicon film, the metal silicide does not function as a barrier.

In order to realize a common interconnection material, it is considered to use a metal material such as aluminum (Al). In the DRAM, since it is a general practice that an interlayer insulating film is formed on the substrate to cover each transistor, a contact hole is formed to penetrate through the interlayer insulating film, and an interconnection material is charged into the contact hole to connect with the gate electrode. However, since the metal is inferior to the n⁺ polysilicon in the property of filling up the contact hole, it is necessary to enlarge the contact hole. This cannot be adopted in a recent highly integrated and microminiaturized semiconductor device.

BRIEF SUMMARY OF THE INVENTION

Accordingly, it is an object of the present invention to provide a semiconductor device and a method for fabricating the same, which have overcome the above mentioned problems of the prior art.

Another object of the present invention is to provide a semiconductor device and a method for fabricating the same, capable of elevating the threshold voltage, without various problems such as an increased leak current caused by increasing the impurity concentration of the channel region, the lowered subthreshold factor caused by using the p⁺ polysilicon film in the gate electrode, the deteriorated insulating performance of the gate oxide film, the increased number of fabricating steps, or the dropped reliability of the transistor.

The above and other objects of the present invention are achieved in accordance with the present invention by a semiconductor device including a first n-channel transistor having a first threshold voltage and a second n-channel transistor having a second threshold voltage, the first threshold voltage being higher than the second threshold voltage, each of the first and second n-channel transistors having a gate electrode including an n-type polysilicon film, wherein the n-type polysilicon film included in the gate electrode of the first n-channel transistor has a first impurity concentration lower than a second impurity concentration in the n-type polysilicon film included in the gate electrode of the second n-channel transistor.

In a preferred embodiment of the semiconductor device, the first impurity concentration is in the range of ½ to ⅒ of the second impurity concentration.

Specifically, when the second impurity concentration is in the range of not less than $2 \times 10^{20}$ atoms/cm³ but not greater than $3 \times 10^{20}$ atoms/cm³, the first impurity concentration can be in the range of not less than $1 \times 10^{19}$ atoms/cm³ but not greater than $1 \times 10^{20}$ atoms/cm³.

In addition, a channel region of the first n-channel transistor can have an impurity concentration equal to that in a channel region of the second n-channel transistor.

In the above mentioned semiconductor device, the impurity concentration of the n-type polysilicon film included in the gate electrode of the first n-channel transistor having a relatively high threshold, is lower than the impurity concentration of the n-type polysilicon film included in the gate electrode of the second n-channel transistor having a relatively low threshold. By decreasing the impurity concentration of the n-type polysilicon film included in the gate electrode, the difference in work function between the gate electrode and a p-type semiconductor substrate becomes small. Therefore, it is possible to elevate the threshold voltage of the transistor without increasing the impurity concentration in the channel region, similarly to the prior art example having the gate electrode formed of the p⁺ polysilicon film.

According to another aspect of the present invention, there is provided a method for fabricating a semiconductor device including a first n-channel transistor having a first threshold voltage and a second n-channel transistor having a second threshold voltage lower than the first threshold voltage, each of the first and second n-channel transistors having a gate electrode including an n-type polysilicon film, the method including the step, after an n-type polysilicon film, which becomes a gate electrode, is formed on a substrate, forming a photoresist on the n-type polysilicon film in an area excluding an area in which the first n-channel transistor is to be formed; and further implanting impurity into the n-type polysilicon in the area in which the first n-channel transistor is to be formed, so that the impurity concentration of the n-type polysilicon in the area in which the first n-channel transistor is to be formed, becomes higher than the impurity concentration of the n-type polysilicon in an area in which the second n-channel transistor is to be formed.

According to still another aspect of the present invention, there is provided a method for fabricating a semiconductor device including a first n-channel transistor having a first threshold voltage and a second n-channel transistor having a second threshold voltage lower than the first threshold voltage, each of the first and second n-channel transistors having a gate electrode including an n-type polysilicon film, the method including the step, after an n-type polysilicon film, which becomes a gate electrode, is formed on a substrate depositing an oxide film on the n-type polysilicon film in an area excluding an area in which the first n-channel transistor is to be formed; and further implanting impurity into the n-type polysilicon in the area in which the first n-channel transistor is to be formed, so that the impurity concentration of the n-type polysilicon in the area in which the first n-channel transistor is to be formed, becomes higher than the impurity concentration of the n-type polysilicon in an area in which the second n-channel transistor is to be formed.

In the above mentioned methods, a channel region of the first n-channel transistor and a channel region of the second n-channel transistor can be simultaneously formed by the same ion implantation step.

In the above mentioned methods for fabricating the semiconductor device, the impurity concentration of the gate electrode formed of the n-type polysilicon film in the first n-channel transistor can be made different from the impurity concentration of the gate electrode formed of the n-type polysilicon film in the second n-channel transistor, without substantially increasing the number of fabricating steps in comparison with the prior art.

The above and other objects, features and advantages of the present invention will be apparent from the following description of preferred embodiments of the invention with reference to the accompanying drawings.

DETAILED DESCRIPTION OF THE INVENTION

Figure 1:
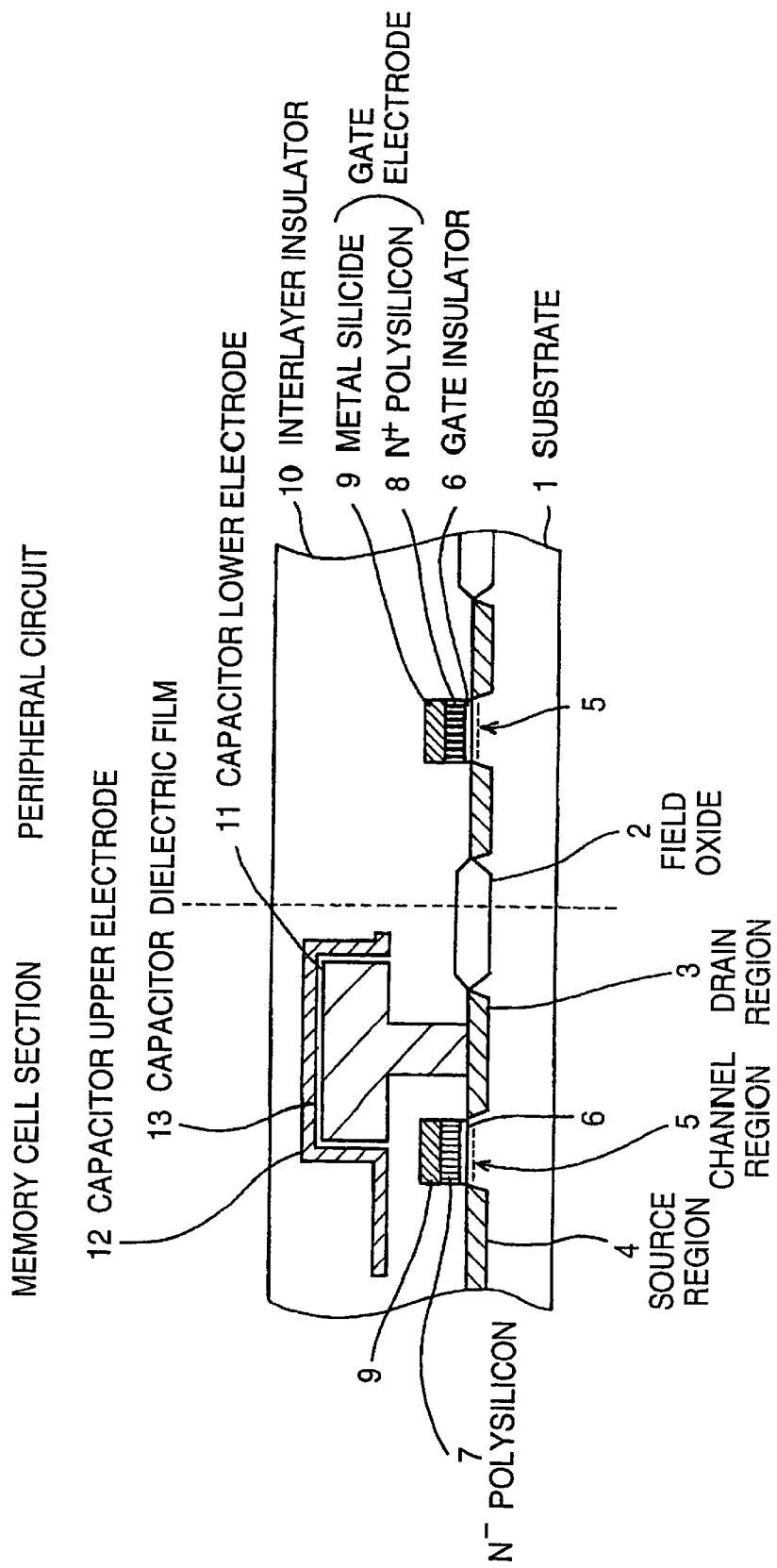
FIG. 1 is a partial diagrammatic section view of the DRAM for illustrating one embodiment of the semiconductor device in accordance with the present invention.
Figure 2:
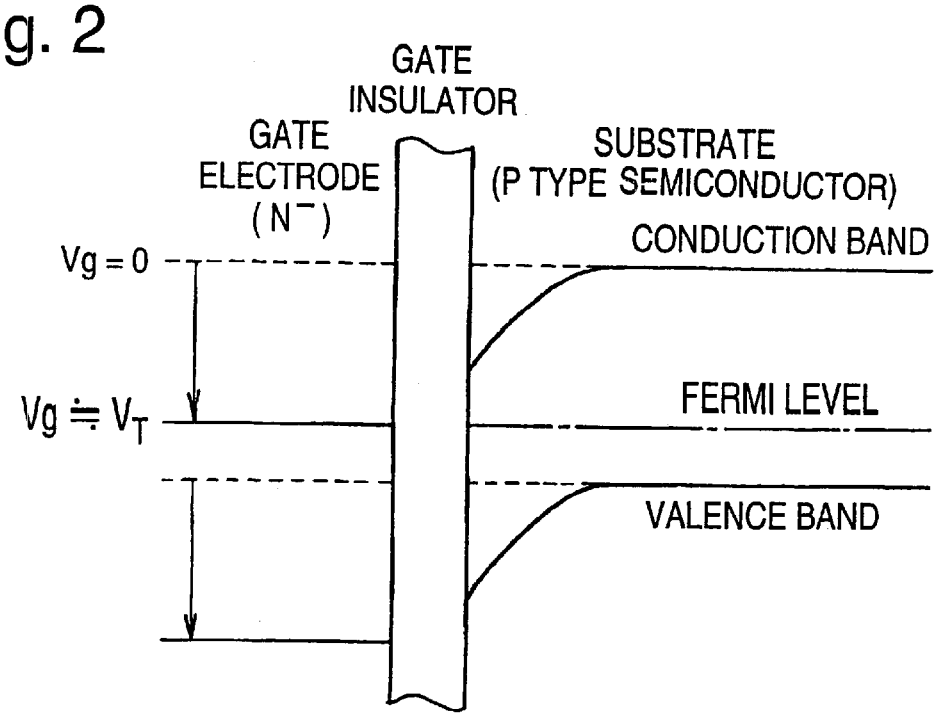
FIG. 2 is an energy band diagram for illustrating an energy level of the gate electrode and the semiconductor substrate in the memory cell FET in the semiconductor device shown in FIG. 1.
Figure 7:
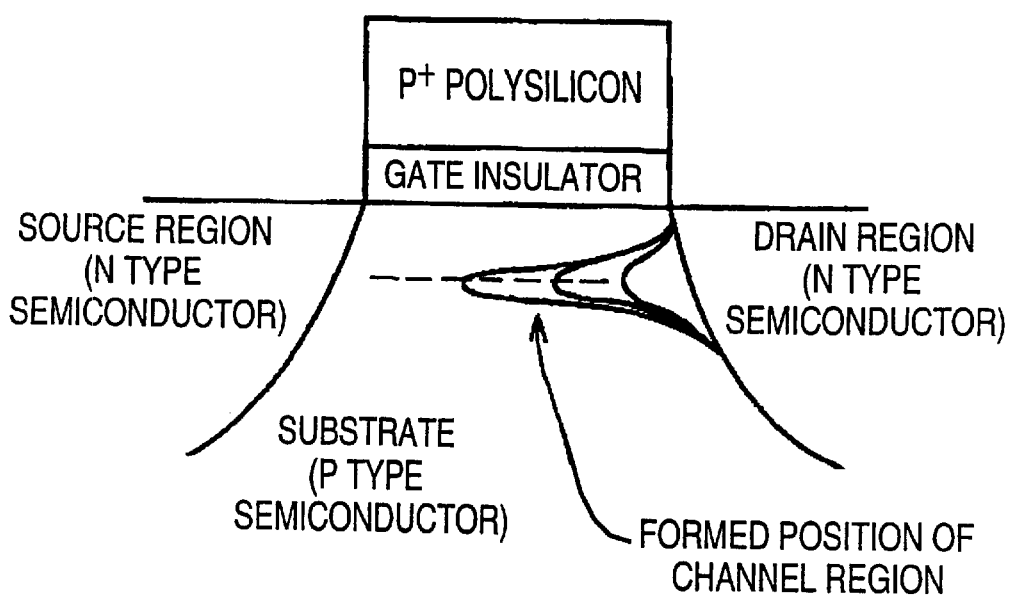
FIG. 7 illustrates a condition in that the channel elongates from the drain by action of the voltage applied between the source and the drain in the memory cell FET when the gate electrode is formed of the $p^+$ polysilicon.
Figure 4:
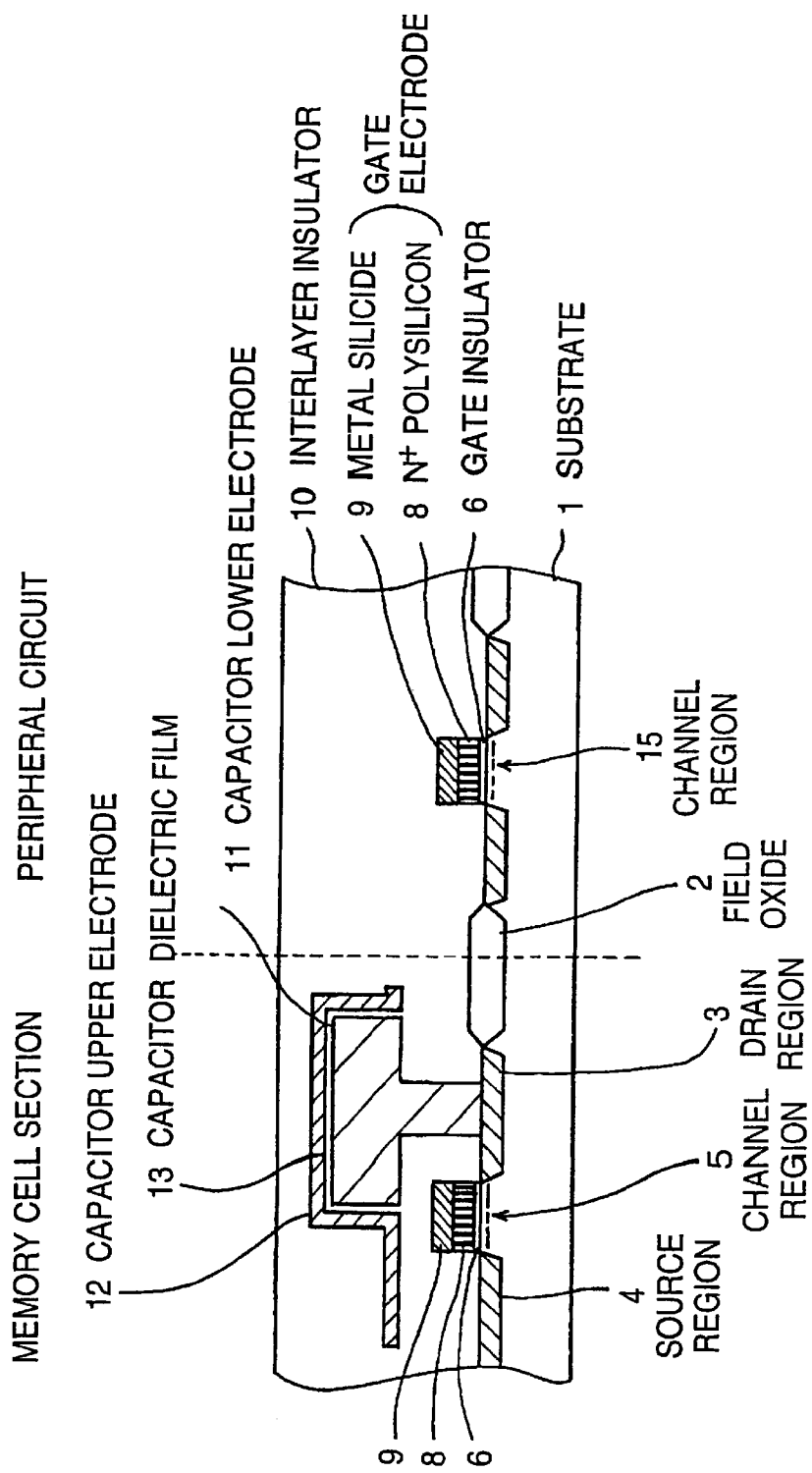
FIG. 4 is a partial diagrammatic section view of the DRAM for illustrating one example of the prior art semiconductor device.
Figure 5A:
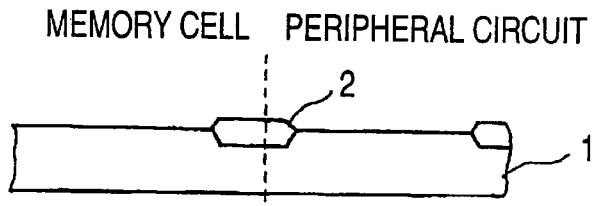
FIGS. 5A to 5F are diagrammatic sectional views of the DRAM for illustrating various steps of the process for fabricating the semiconductor device shown in FIG. 4.
Figure 5B:
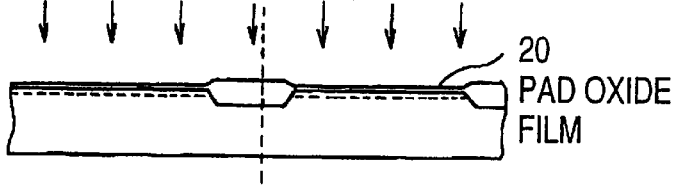
Figure 5C:
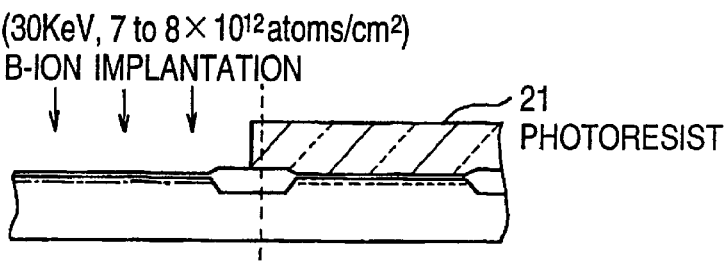
Figure 5D:
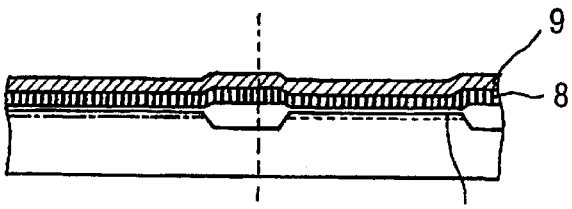
Figure 5E:
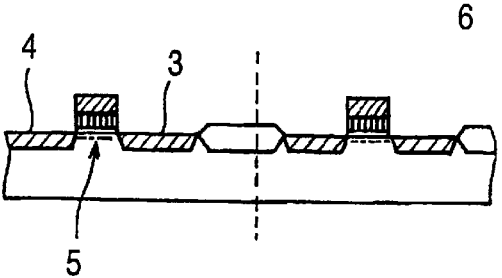
Figure 5F:
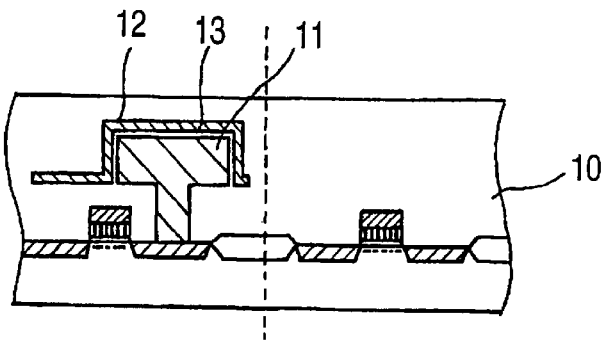
Figure 6A:
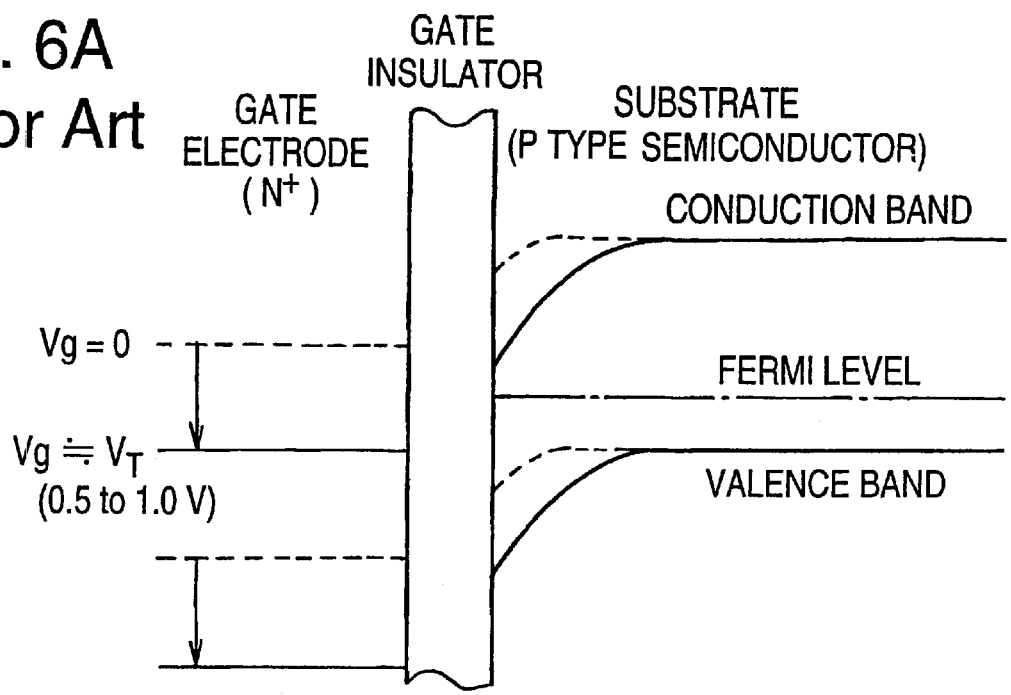
FIGS. 6A and 6B are energy band diagrams for illustrating an energy level of the gate electrode and the semiconductor substrate in the FET in the prior arts semiconductor device.
Figure 6B:
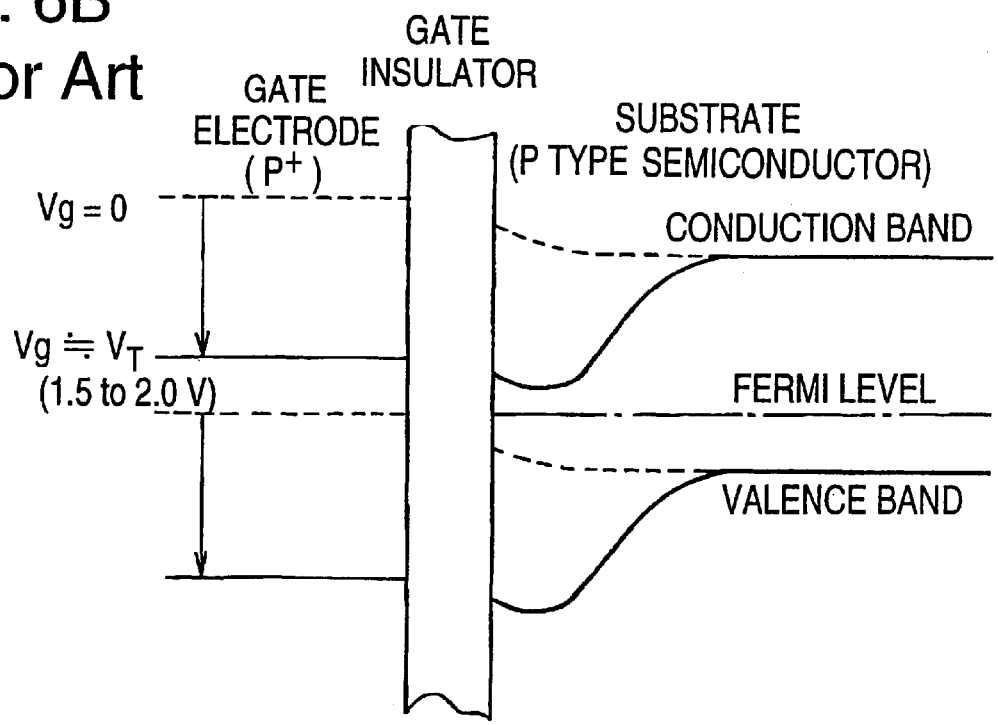

Referring to FIG. 1, there is shown a partial diagrammatic section view of the DRAM for illustrating one embodiment of the semiconductor device in accordance with the present invention. In FIG. 1, elements corresponding to those shown in FIG. 4 are given the same reference numbers. FIG. 2 is an energy band diagram for illustrating an energy level of the gate electrode and the semiconductor substrate in the memory cell FET in the semiconductor device shown in FIG. 1. In FIG. 2, the dotted lines indicate the energy level at the time of the gate voltage Vg=0 V, and the solid lines indicate the energy level when the gate voltage Vg is the threshold $V_T$.

As shown in FIG. 1, the DRAM of this embodiment is so configured that a gate electrode of the memory cell FET is formed of a multilayer film composed of an n-type polysilicon film and a refractory metal silicide film, the n-type polysilicon film having an impurity concentration lower than that of the n-type polysilicon film included in the multilayer gate electrode of the peripheral circuit FET. The n-type polysilicon film included in the multilayer gate electrode of the memory cell FET is shown as an $n^-$ polysilicon film 7. On the other hand, the channel region 5 of the memory cell FET and the channel region 5 of the peripheral circuit FET have an equal impurity concentration. Since the other construction is the same as that of the prior art example shown in FIG. 4, a further explanation will be omitted for simplification of the description. Incidentally, the equal impurity concentration in the channel regions 5 of the memory cell FET and the peripheral circuit FET is illustrated by equalizing the thickness of the dotted lines depicted in the respective channel regions in FIG. 1. On the other hand, the different impurity concentrations in the n-type polysilicon film of the gate electrode are illustrating by changing the thickness of the vertical solid lines depicted in the respective gate electrode n-type polysilicon films in FIG. 1.

As in this embodiment, by decreasing the impurity concentration of the n-type polysilicon film included in the gate electrode, the difference in work function between the gate electrode and a p-type semiconductor substrate becomes small, as seen from FIG. 2. Therefore, it is possible to elevate the threshold voltage of the FET without increasing the impurity concentration in the channel region, similarly to the prior art example having the gate electrode formed of the $p^+$ polysilicon film Accordingly, the threshold voltage can be easily elevated without various problems such as an increased leak current caused by increasing the impurity concentration of the channel region, the lowered subthreshold factor caused by using the $p^+$ polysilicon film in the gate electrode, the deteriorated insulating performance of the gate oxide film, the increased number of fabricating steps, or the dropped reliability of the transistor.

Here, the impurity concentration of the n-type polysilicon film included in the gate electrode of the memory cell FET is preferred to be in the range of ½ to ⅒ of the impurity concentration (2 to $3 \times 10^{20}$ atoms/cm$^3$) of the n-type polysilicon film included in the gate electrode of the peripheral circuit FET. More specifically, it is preferred to be in the range of not less than $1 \times 10^{19}$ atoms/cm$^3$ but not greater than $1 \times 10^{20}$ atoms/cm$^3$. The reason for this is that: If the impurity concentration of the n-type polysilicon film is greater than $1 \times 10^{20}$ atoms/cm$^3$, a substantial difference does not appear in the threshold voltage of the FET. If the impurity concentration is less than $1 \times 10^{19}$ atoms/cm$^3$, the n-polysilicon film of the gate electrode becomes a depletion condition, so that even if the gate voltage is applied the FET is no longer turned on.

Now, the process for fabricating the semiconductor device shown in FIG. 1 will be described with reference to FIGS. 3A to 3F, which are diagrammatic sectional views of the DRAM for illustrating various steps of the process for fabricating the semiconductor device shown in FIG. 1.

Figure 3A:
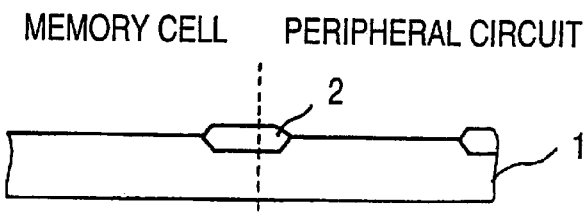
FIGS. 3A to 3F are diagrammatic sectional views of the DRAM for illustrating various steps of the process for fabricating the semiconductor device shown in FIG. 1.

First, a silicon nitride film is formed on a principal surface of a p-type semiconductor substrate 1, and is patterned to have a predetermined shape. The substrate exposed in an opening of the patterned silicon nitride film is selectively oxidized to form a field oxide film 2 having the thickness on the order of 300 nm, which constitutes an inactive region for a device isolation, as shown in FIG. 3A. Here, the device isolation region may be a shallow trench isolation (STI).

Figure 3B:
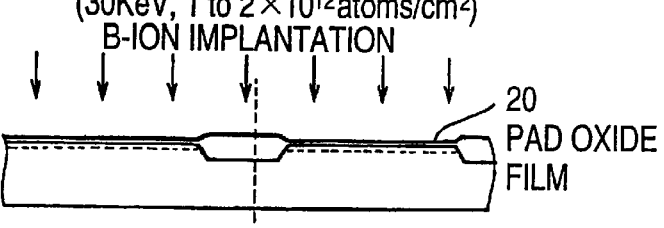
Figure 3C:
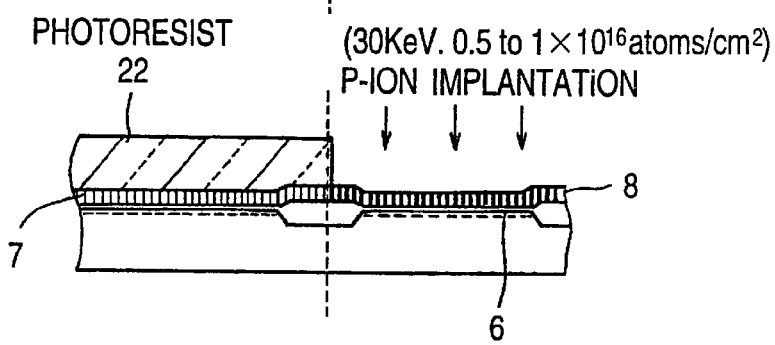

Succeedingly, a pad oxide film 20 having the thickness on the order of 20 nm is formed on the whole of the principal surface of the substrate by means of a thermal oxidation. In order to form the channel regions, boron (B) is ion-implanted through the pad oxide film 20 with an energy of 30 KeV and a dose of 1 to $2 \times 10^{12}$ atoms/cm$^2$ (FIG. 3B).

Thereafter, the pad oxide film 20 formed on the substrate 1 is removed, and a gate oxide film 6 having the thickness on the order of 10 nm is formed on the principal surface of the substrate by means of a thermal oxidation. Then, an $n^-$ polysilicon film (doped silicon) 7 having a low impurity concentration (on the order of $1 \times 10^{19}$ to $1 \times 10^{20}$ atoms/cm$^3$) and a thickness on the order of 100 nm, which is used to forms a gate electrode, is deposited on the gate oxide film 6. Succeedingly, a photoresist 22 is formed on the $n^-$ polysilicon film 7 to cover an area excluding a region in which the peripheral circuit FET is formed, and phosphorus (P) is ion-implanted into the region in which the peripheral circuit FET is formed, with an energy of 30 KeV and a dose of 0.5 to $1 \times 10^{16}$ atoms/cm$^2$ (FIG. 3C), so that $n^-$ polysilicon film 7 is converted into an $n^+$ polysilicon film 8 in the region in which the peripheral circuit FET is formed. Thus, the impurity concentration of the n-type polysilicon film included in the gate electrode of the peripheral circuit FET is made different from the impurity concentration of the n-type polysilicon film included in the gate electrode of the memory cell FET. Incidentally, it is a matter of course that it is possible to cover the area excluding the region in which the peripheral circuit FET is formed, by an oxide film in place of the photoresist 22 (as an ion implantation masking layer), and to diffuse the phosphorus (P) into the region in which the peripheral circuit FET is formed.

Figure 3D:
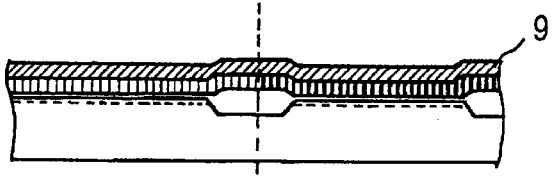

Then, the photoresist 22 (or the oxide film) is removed, and a refractory metal silicide film (WSi) 9 having the thickness on the order of 100 nm, is deposited-on the n⁻ polysilicon film 7 and the n⁺ polysilicon film 8 (FIG. 3D).

Figure 3E:
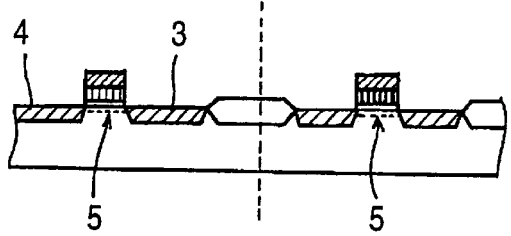

Succeedingly, the n⁻ polysilicon film 7, die n⁺ polysilicon film 8 and the metal silicide film 9 are patterned by a lithography, to form a gate electrode of the memory cell FET and a gate electrode of the peripheral circuit FET, respectively. In addition, in order to form the drain region 3 and the source region 4 of each FET, arsenic (As) is ion-implanted with a dose of $1\times10^{16}$ atoms/cm², and then, is thermally diffused to form an n⁺ diffused layer (FIG. 3E).

Figure 3F:
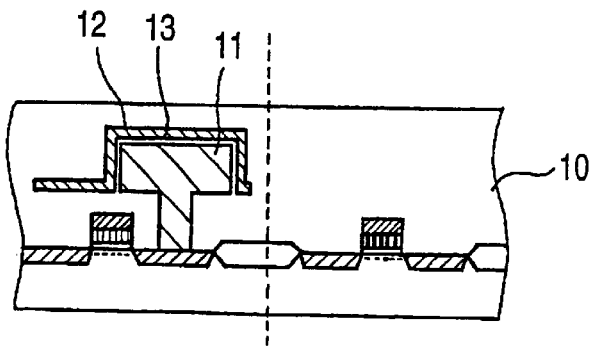

Thereafter, an interlayer insulating film 10 having the thickness on the order of 500 nm is deposited on the whole of the principal surface of the substrate to cover the gate electrodes. A contact hole is formed in the interlayer insulating film 10 to reach the drain region 4 of the memory cell FET, and a phosphorus (P) doped n⁺ polysilicon is deposited to fill up the contact hole and to form a capacitor lower electrode 11. Succeedingly, a capacitor dielectric film 13 having the thickness on the order of 8 nm is deposited on the capacitor lower electrode 11. Furthermore, a phosphorus (P) doped n⁺ polysilicon is deposited on the capacitor dielectric film 13 to have a thickness on the order of 200 nm, thereby to form a capacitor upper electrode 12. Finally, an interlayer insulating film 10 is deposited on the whole of the principal surface of the substrate to cover the capacitor upper electrode 12 (FIG. 3F). Incidentally, in FIGS. 1 and 3F, the interlayer insulating film 10 shown as being formed of only one layer, but is actually formed of a plurality of layers as seen from the above mentioned process.

If the semiconductor device is fabricated by the above mentioned process, the impurity concentration of the gate electrode formed of the n-type polysilicon film in the memory cell FET can be made different from the impurity concentration of the gate electrode formed of the n-type polysilicon film in the peripheral circuit FET, without substantially increasing the number of fabricating steps in comparison with the prior art.

In the above explanation, the present invention is applied to the DRAM in which a memory cell FET having a high threshold voltage and a peripheral circuit FET having a low threshold voltage are formed on a single semiconductor substrate. However, it would be a matter of course to persons skilled in the art that the present invention can be applied to a semiconductor device having a plurality of transistors (particularly, n-channel MOS FETs) having different threshold voltages.

As seen from the above, in the semiconductor device in accordance with the present invention, the impurity concentration of the n-type polysilicon film included in the gate electrode of the first n-channel transistor having a relatively high threshold, is lower than the impurity concentration of the n-type polysilicon film included in the gate electrode of the second n-channel transistor having a relatively low threshold. By decreasing the impurity concentration of the n-type polysilicon film included in the gate electrode, the difference in work function between the gate electrode and a p-type semiconductor substrate becomes small. Therefore, it is possible to elevate the threshold voltage of the transistor without increasing the impurity concentration in the channel region, similarly to the prior art example having the gate electrode formed of the p⁺ polysilicon film.

Accordingly, the threshold voltage can be easily elevated without various problems such as an increased leak current caused by increasing the impurity concentration of the channel region, the lowered subthreshold factor caused by using the p⁺ polysilicon film in the gate electrode, the deteriorated insulating performance of the gate oxide film, the increased number of fabricating steps, or the dropped reliability of the transistor.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor device including
   a first n-channel transistor having a first threshold voltage and
   a second n-channel transistor having a second threshold voltage, said first threshold voltage being higher than said second threshold voltage,
   each of said first and second n-channel transistors having a gate electrode including an n-type polysilicon film,
   said n-type polysilicon film included in said gate electrode of said first n-channel transistor having a first impurity concentration lower than a second impurity concentration in said n-type polysilicon film included in said gate electrode of said second n-channel transistor,
   said first impurity concentration being in the range of ½ to ¹⁄₁₀ of said second impurity concentration.

2. A semiconductor device claimed in claim 1 wherein
   said second impurity concentration is in the range of not less than $2\times10^{20}$ atoms/cm³ but not greater than $3\times10^{20}$ atoms/cm³, and
   said first impurity concentration is in the range of not less than $1\times10^{19}$ atoms/cm³ but not greater than $1\times10^{20}$ atoms/cm³.

3. A semiconductor device claimed in claim 1 wherein a channel region of said first n-channel transistor has an impurity concentration equal to that in a channel region of said second n-channel transistor.

4. A semiconductor device claimed in claim 2 wherein a channel region of said first n-channel transistor has an impurity concentration equal to that in a channel region of said second n-channel transistor.

* * * * *